(12) United States Patent
Arisawa et al.

(10) Patent No.: US 7,446,852 B2
(45) Date of Patent: Nov. 4, 2008

(54) PROJECTION EXPOSURE MASK ACCEPTANCE DECISION SYSTEM, PROJECTION EXPOSURE MASK ACCEPTANCE DECISION METHOD, METHOD FOR MANUFACTURING SEMICONDUCTOR DEVICE, AND COMPUTER PROGRAM PROJECT

(75) Inventors: Yukiyasu Arisawa, Tokyo (JP); Shoji Mimotogi, Yokohama (JP); Shigeru Hasebe, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 73 days.

(21) Appl. No.: 11/653,279

(22) Filed: Jan. 16, 2007

(65) Prior Publication Data

US 2007/0182941 A1    Aug. 9, 2007

(30) Foreign Application Priority Data

Jan. 16, 2006   (JP)   ............................... 2006-007625

(51) Int. Cl.
*G03B 27/68* (2006.01)
*G03B 27/52* (2006.01)
*G03F 1/00* (2006.01)

(52) U.S. Cl. ................................ 355/52; 355/55; 430/5

(58) Field of Classification Search .................... 355/52, 355/53, 55, 75; 430/5, 20, 30, 311; 716/19, 716/21

See application file for complete search history.

(56) References Cited

U.S. PATENT DOCUMENTS

| 6,649,310 B2 * | 11/2003 | Itoh et al. ....................... 430/5 |
| 6,873,720 B2 * | 3/2005 | Cai et al. ..................... 382/149 |
| 7,008,731 B2 | 3/2006 | Nojima et al. |
| 2004/0137340 A1 | 7/2004 | Mimotogi et al. |
| 2005/0132322 A1 * | 6/2005 | Inoue .......................... 716/19 |

FOREIGN PATENT DOCUMENTS

JP   2002-72440   3/2002

* cited by examiner

*Primary Examiner*—Hung Henry Nguyen
(74) *Attorney, Agent, or Firm*—Finnegan, Henderson, Farabow, Garrett & Dunner, L.L.P.

(57) ABSTRACT

A projection exposure mask acceptance decision system includes assurance object measuring unit to measure quality assurance objects relating to projection exposure mask, first exposure characteristic deterioration quantity calculating unit to calculate first exposure characteristic deterioration quantity caused by deviations in average values of the quality assurance objects measured by the measuring unit, second exposure characteristic deterioration quantity calculating unit to calculate second exposure characteristic deterioration quantity caused by dispersion in the quality assurance objects measured by the measuring unit, sum calculating unit to calculate simple sum of the first and second quantity, root sum square calculating unit to calculate root sum square of the first and second quantity, entire exposure characteristic deterioration quantity calculating unit to calculate entire exposure characteristic deterioration quantity as an interior division value of the simple sum and root sum square, and judgment unit to judge whether the entire exposure characteristic deterioration quantity is acceptable value.

10 Claims, 7 Drawing Sheets

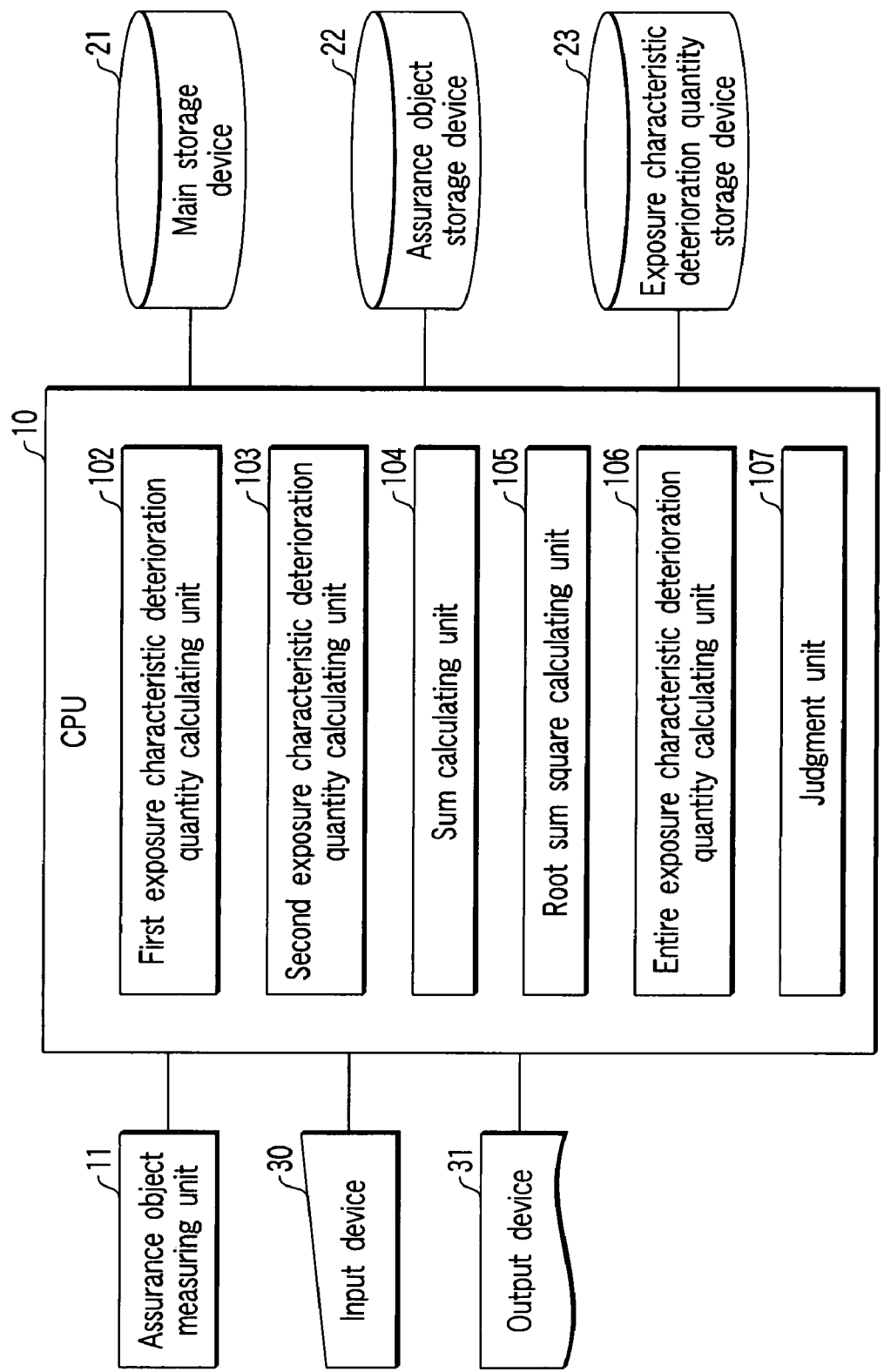
F I G. 1

|  | Average values | Standard deviations |
|---|---|---|
| CD [nm] | 355 | 2.2 |
| Phase shift [deg] | 185 | 1.8 |
| Transmittance [%] | 6 | 0.11 |

FIG. 2

|  | Exposure characteristic deterioration quantities caused by average values | Exposure characteristic deterioration quantities caused by dispersion |
|---|---|---|
| Quality assurance object 1 : CD | $\mu_1$ | $\sigma_1$ |
| Quality assurance object 2 : Phase shift | $\mu_2$ | $\sigma_2$ |
| Quality assurance object 3 : Transmittance | $\mu_3$ | $\sigma_3$ |
| ⋮ | ⋮ | ⋮ |
| Quality assurance object n | $\mu_n$ | $\sigma_n$ |
| Total | First exposure characteristic deterioration quantity $S_\mu$ | Second exposure characteristic deterioration quantity $S_\sigma$ |

FIG. 3

|  | Caused by average values | Caused by dispersion |
|---|---|---|
| Caused by CD | 0.24% | 6.70% |
| Caused by phase shift | 0.03% | 0.02% |
| Caused by transmittance | 0.02% | 1.35% |

FIG. 4

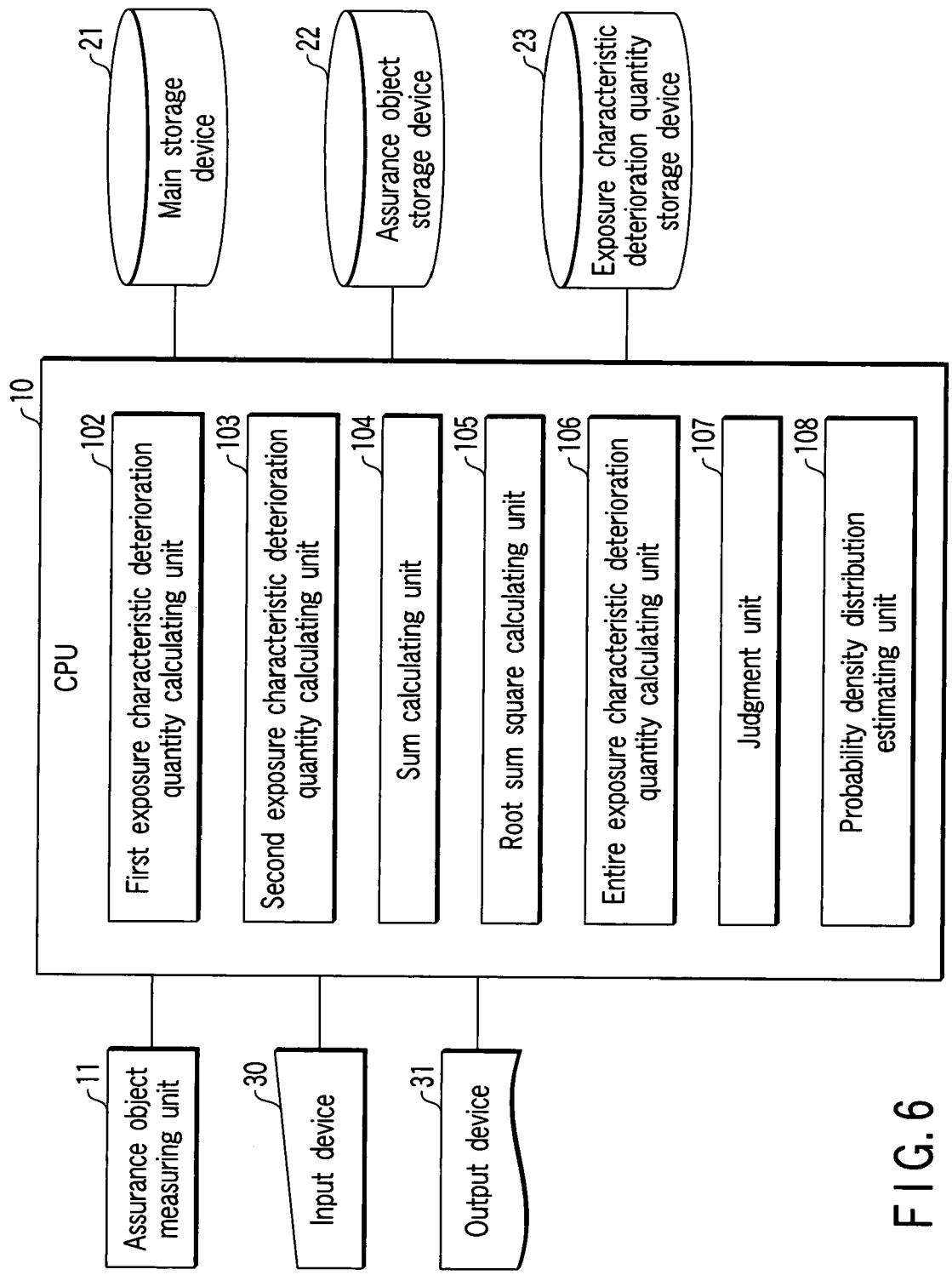
F I G. 6

| | |
|---|---|
| $\varepsilon 40$ | 0.011719 |
| $\varepsilon 31$ | -0.05371 |
| $\varepsilon 30$ | -0.01254 |
| $\varepsilon 22$ | 0.001287 |
| $\varepsilon 21$ | -0.00269 |
| $\varepsilon 20$ | -0.07813 |
| $\varepsilon 13$ | -0.1377 |
| $\varepsilon 12$ | -0.02039 |
| $\varepsilon 11$ | 0.001673 |
| $\varepsilon 10$ | 0.158203 |
| $\varepsilon 04$ | -0.08936 |
| $\varepsilon 03$ | 0.07143 |
| $\varepsilon 02$ | 0.054688 |
| $\varepsilon 01$ | 0.017578 |
| $\varepsilon 00$ | -1.34607 |
F I G. 7
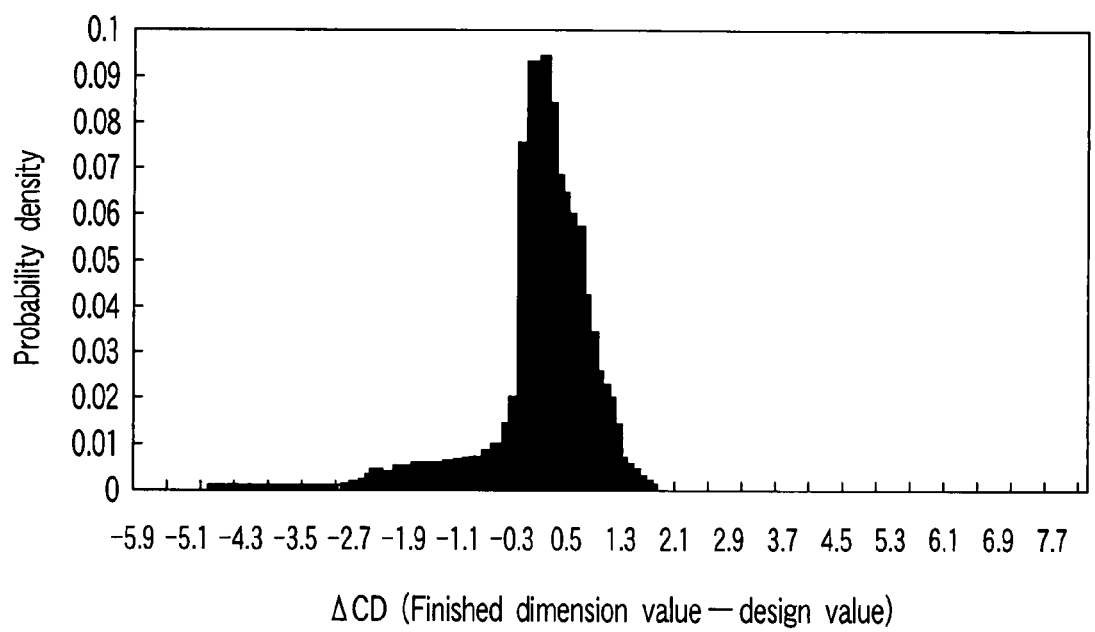
F I G. 8

PROJECTION EXPOSURE MASK ACCEPTANCE DECISION SYSTEM, PROJECTION EXPOSURE MASK ACCEPTANCE DECISION METHOD, METHOD FOR MANUFACTURING SEMICONDUCTOR DEVICE, AND COMPUTER PROGRAM PROJECT

CROSS-REFERENCE TO RELATED APPLICATIONS

This application is based upon and claims the benefit of priority from prior Japanese Patent Application No. 2006-007625, filed Jan. 16, 2006, the entire contents of which are incorporated herein by reference.

BACKGROUND OF THE INVENTION

1. Field of the Invention

The present invention relates to a projection exposure mask acceptance decision system and a projection exposure mask acceptance decision method for a projection exposure mask used in manufacturing process for semiconductor device, a method for manufacturing a semiconductor device, and a computer program product.

2. Description of Related Art

The manufacturing process for semiconductor device includes a pattern formation process (lithography process) for forming various patterns on a semiconductor wafer. In a lithography process, a projection exposure mask or the like is used. By measuring the dimensions of the patterns formed by the lithography process, an average value and an in-plane uniformity of the pattern dimensions are obtained. An exposure characteristic deterioration quantity of the used projection exposure mask is calculated on the basis of the determined average value and in-plane uniformity. An exposure characteristic deterioration quantity is, for example, an exposure margin deterioration quantity. Depending on whether a projection exposure mask satisfies an exposure characteristic deterioration quantity required for a lithography process, it is judged whether the projection exposure mask is acceptable or not (Jpn. Pat. Appln. KOKAI Publication No. 2002-72440).

In a projection exposure mask, there are a plurality of quality assurance objects such as a line width (CD), a phase shift, transmittance, and the like. A first exposure characteristic deterioration quantity S1 caused by deviations from the respective average values of a plurality of quality assurance objects is obtained by a simple sum of the respective exposure characteristic deterioration quantities of the plurality of quality assurance objects. A second exposure characteristic deterioration quantity S2 caused by respective dispersion of a plurality of quality assurance objects is obtained by calculating a root sum square of the respective exposure characteristic deterioration quantities of the plurality of quality assurance objects. Then, an entire exposure characteristic deterioration quantity ΔELa of a projection exposure mask is obtained by a sum of the first exposure characteristic deterioration quantity S1 and the second exposure characteristic deterioration quantity S2.

BRIEF SUMMARY OF THE INVENTION

According to an aspect of the present invention, there is provided a projection exposure mask acceptance decision system comprising: an assurance object measuring unit configured to measure a plurality of quality assurance objects relating to a projection exposure mask; a first exposure characteristic deterioration quantity calculating unit configured to calculate a first exposure characteristic deterioration quantity caused by deviations in average values of the plurality of quality assurance objects measured by the assurance object measuring unit; a second exposure characteristic deterioration quantity calculating unit configured to calculate a second exposure characteristic deterioration quantity caused by dispersion in the plurality of quality assurance objects measured by the assurance object measuring unit; a sum calculating unit configured to calculate a simple sum of the first exposure characteristic deterioration quantity and the second exposure characteristic deterioration quantity; a root sum square calculating unit configured to calculate a root sum square of the first exposure characteristic deterioration quantity and the second exposure characteristic deterioration quantity; an entire exposure characteristic deterioration quantity calculating unit configured to calculate an entire exposure characteristic deterioration quantity as an interior division value of the simple sum and the root sum square; and a judgment unit configured to judge whether the entire exposure characteristic deterioration quantity is an acceptable value.

According to an aspect of the present invention, there is provided a projection exposure mask acceptance decision method comprising: measuring a plurality of quality assurance objects relating to a projection exposure mask; calculating a first exposure characteristic deterioration quantity caused by deviations in average values of the plurality of quality assurance objects measured by the assurance object measuring unit; calculating a second exposure characteristic deterioration quantity caused by dispersion in the plurality of quality assurance objects which measured by the assurance object measuring unit; calculating a simple sum of the first exposure characteristic deterioration quantity and the second exposure characteristic deterioration quantity; calculating a root sum square of the first exposure characteristic deterioration quantity and the second exposure characteristic deterioration quantity; calculating an entire exposure characteristic deterioration quantity as an interior division value of the simple sum and the root sum square; and judging whether the entire exposure characteristic deterioration quantity is an acceptable value.

According to an aspect of the present invention, there is provided a method for manufacturing a semiconductor device comprising applying resist on a substrate including a semiconductor substrate; forming a resist pattern including disposing a projection exposure mask which is judged as acceptable by the projection exposure mask acceptance decision system according to an aspect of the present invention, above the substrate, irradiating light or an electron beam onto the resist via the projection exposure mask, and developing the resist onto which the light or the electron beam is irradiated; and forming a pattern by etching the substrate by using the resist pattern as a mask.

According to an aspect of the present invention, there is provided a computer program product configured to store program instructions for execution on a computer system enabling the computer system to perform: an instruction for measuring a plurality of quality assurance objects relating to a projection exposure mask; an instruction for calculating a first exposure characteristic deterioration quantity caused by deviations in average values of the plurality of quality assurance objects which have been measured by the assurance object measuring unit; an instruction for calculating a second exposure characteristic deterioration quantity caused by dispersion in the plurality of quality assurance objects which have been measured by the assurance object measuring unit; an instruction for calculating a simple sum of the first exposure characteristic deterioration quantity and the second exposure characteristic deterioration quantity; an instruction for calculating a root sum square of the first exposure characteristic deterioration quantity and the second exposure characteristic deterioration quantity; an instruction for calculating an entire exposure characteristic deterioration quantity as an interior division value of the simple sum and the root sum square; and an instruction for judging whether the entire exposure characteristic deterioration quantity is an acceptable value.

BRIEF DESCRIPTION OF THE SEVERAL VIEWS OF THE DRAWING

FIG. 1 is a schematic diagram of a projection exposure mask acceptance decision system according to a first embodiment;

FIG. 2 is a table showing an example of results in which quality assurance objects are measured by using the projection exposure mask acceptance decision system according to the first embodiment;

FIG. 3 is a table showing exposure characteristic deterioration quantities with respect to quality assurance objects which are calculated by the projection exposure mask acceptance decision system according to the first embodiment;

FIG. 4 is a view showing an example of exposure characteristic deterioration quantities with respect to quality assurance objects which are calculated by the projection exposure mask acceptance decision system according to the first embodiment;

FIG. 6 is a schematic diagram of a projection exposure mask acceptance decision system according to a second embodiment;

FIG. 7 is a table showing an example of indexes used for showing a probability density distribution in the projection exposure mask acceptance decision system according to the second embodiment;

FIG. 8 is a graph showing a probability density distribution obtained by the projection exposure mask acceptance decision system according to the second embodiment;

DETAILED DESCRIPTION OF THE INVENTION

Figure 5:
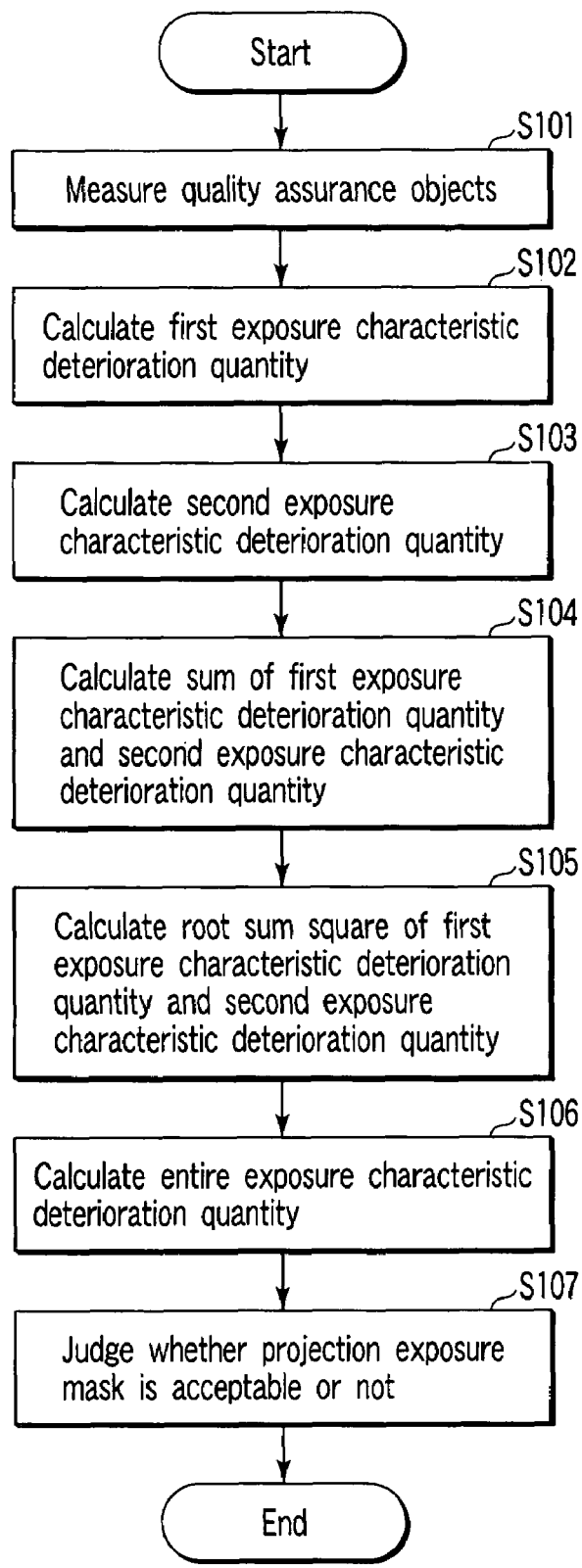
FIG. 5 is a flowchart showing a projection exposure mask acceptance decision method according to the first embodiment.

Hereinafter, embodiments of the present invention will be described with reference to the drawings.

FIRST EMBODIMENT

Conventionally, an entire exposure characteristic deterioration quantity $\Delta ELa$ of a projection exposure mask is, as described above, obtained by a sum of a first exposure characteristic deterioration quantity $S\mu$ and a second exposure characteristic deterioration quantity $S\sigma$.

However, from the standpoint of statistical logic, an entire exposure characteristic deterioration quantity $\Delta ELa$ is thought of as:

$$(S\mu^2 + S\sigma^2)^{1/2} \leq \Delta ELa \leq S\mu + S\sigma \quad (1)$$

Namely, it is hard to say that a conventional acceptance criterion is sufficiently precise.

Further, conventionally, it is assumed that dispersion in quality assurance objects uniformly comply with a normal distribution. However, in fact, there is dispersion in quality assurance objects complying with a probability density distribution different from the normal distribution. In this case, regardless of the fact that the dispersion in the quality assurance objects comply with the probability density distribution different from the normal distribution, a desired significance level is set supposing that the dispersion in quality assurance objects comply with the normal distribution. When an exposure characteristic deterioration quantity at an upper limit or a lower limit within a confidence interval in the normal distribution which is determined on the basis of such a significance level is calculated, it is hard to say that the calculation of an exposure characteristic deterioration quantity is precisely carried out.

Hereinafter, an embodiment taking the above-descried circumstances into consideration will be described.

A projection exposure mask acceptance decision system according to a first embodiment has, as shown in FIG. 1, a central processor unit (CPU) 10, a main storage device 21, an assurance object storage device 23, an exposure characteristic deterioration quantity storage device 23, an input device 30, and an output device 31.

The CPU 10 has an assurance object measuring unit 11 for measuring a plurality of quality assurance objects of a projection exposure mask, a first exposure characteristic deterioration quantity calculating unit 102 for calculating a first exposure characteristic deterioration quantity caused by deviations in the average values of the plurality of quality assurance objects, a second exposure characteristic deterioration quantity calculating unit 103 for calculating a second exposure characteristic deterioration quantity caused by dispersion in the plurality of quality assurance objects, a sum calculating unit 104 for calculating a simple sum of the first exposure characteristic deterioration quantity and the second exposure characteristic deterioration quantity, a root sum square calculating unit 105 for calculating a root sum square of the first exposure characteristic deterioration quantity and the second exposure characteristic deterioration quantity, an entire exposure characteristic deterioration quantity calculating unit 106 for calculating an entire exposure characteristic deterioration quantity as an interior division value of the simple sum and the root sum square of the first exposure characteristic deterioration quantity and the second exposure characteristic deterioration quantity, and a judgment unit 107 for judging whether the entire exposure characteristic deterioration quantity is an acceptable value. The CPU 10 further has a storage device managing unit which is not shown in the figure. "Quality assurance objects" are elements such as a CD, a phase shift, transmittance, and the like, which are used for assuring exposure margins of a projection exposure mask.

The assurance object measuring unit 11 measures a plurality of quality assurance objects of a projection exposure mask such as a photomask, a phase shift mask, an electron beam (EB) mask, or the like. The assurance object measuring unit 11 stores measured results of the plurality of quality assurance objects into the assurance object storage device 22. An example of results in which the plurality of quality assurance objects are measured is shown in FIG. 2.

The first exposure characteristic deterioration quantity calculating unit 102 first calculates exposure characteristic deterioration quantities $\mu 1$, $\mu 2$, $\mu 3$, . . . , and $\mu n$ caused by deviations between the target values and the average values of the measured results with reference to the measured results of the quality assurance objects stored in the assurance object storage device 22.

For example, an exposure characteristic deterioration quantity μ caused by a change in an average value of pattern dimensions (CD) is calculated by subtracting an exposure margin when the pattern is finished such that the pattern dimensions are uniformly changed by Δμ, from an exposure margin when the pattern is finished so as to accord to a designed mask value. An exposure margin may be light exposure margin, or DOF margin. Further, the quality assurance objects other than dimensions are in the same way.

An example of calculated exposure characteristic deterioration quantities μ1, μ2, μ3, . . . , and μn is shown in FIG. 3. As a simple sum of the exposure characteristic deterioration quantities μ1, μ2, μ3, . . . , and μn, a first exposure characteristic deterioration quantities Sμ is calculated.

The first exposure characteristic deterioration quantity calculating unit 102 stores the calculated first exposure characteristic deterioration quantity Sμ into the exposure characteristic deterioration quantity storage device 23.

With respect to the exposure characteristic deterioration quantities μ1, μ2, and μ3 calculated on the basis of the measured results of the quality assurance objects shown in FIG. 2, as shown in FIG. 4, the exposure characteristic deterioration quantity μ1 caused by a deviation in an average value of a CD is 0.24%, the exposure characteristic deterioration quantity μ2 caused by a deviation in an average value of a phase shift is 0.03%, and the exposure characteristic deterioration quantity μ3 caused by a deviation in an average value of transmittance is 0.02%. Accordingly, the first exposure characteristic deterioration quantity Sμ is calculated to be 0.29%.

The second exposure characteristic deterioration quantity calculating unit 103 calculates a standard deviation on the basis of deviations in the measured results with reference to the measured results of the quality assurance objects stored in the assurance object storage device 22, and calculates the exposure characteristic deterioration quantities σ1, σ2, and σ3, . . . , and σn caused by deviations.

For example, an exposure characteristic deterioration quantity σ caused by a deviation in pattern dimensions is calculated by subtracting an exposure margin when the pattern has deviations, from an exposure margin when the pattern is finished so as to accord to a designed mask value. An exposure margin may be light exposure margin or a DOF margin. Further, the quality assurance objects other than dimensions are in the same way.

An example of calculated exposure characteristic deterioration quantities σ1, σ2, σ3, . . . , and σn is shown in FIG. 3. A second exposure characteristic deterioration quantity Sσ is calculated as a root sum square of the exposure characteristic deterioration quantities caused by the respective deviations in the quality assurance objects.

The second exposure characteristic deterioration quantity calculating unit 103 stores the calculated second exposure characteristic deterioration quantity Sσ into the exposure characteristic deterioration quantity storage device 23. With respect to the exposure characteristic deterioration quantities σ1, σ2, and σ3 calculated on the basis of the measured results of the quality assurance objects shown in FIG. 2, as shown in FIG. 4, the exposure characteristic deterioration quantity σ1 caused by a deviation in an average value of a CD is 6.7%, the exposure characteristic deterioration quantity σ2 caused by a deviation in an average value of a phase shift is 0.02%, and the exposure characteristic deterioration quantity σ3 caused by a deviation in an average value of transmittance is 1.3%. Accordingly, the second exposure characteristic deterioration quantity Sσ is calculated to be 6.8%.

The sum calculating unit 104 reads the first exposure characteristic deterioration quantity Sμ and the second exposure characteristic deterioration quantity Sσ which are stored in the exposure characteristic deterioration quantity storage device 23, and calculates a simple sum A of the first exposure characteristic deterioration quantity Sμ and the second exposure characteristic deterioration quantity Sσ. Namely, the simple sum A is expressed by $$A = S\mu + S\sigma \quad (2).$$

The simple sum A based on the measured results of the quality assurance objects shown in FIG. 2 is calculated to be 7.1% in accordance with the formula (2).

The root sum square calculating unit 105 reads the first exposure characteristic deterioration quantity Sμ and the second exposure characteristic deterioration quantity Sσ which are stored in the exposure characteristic deterioration quantity storage device 23, and calculates a root sum square B of the first exposure characteristic deterioration quantity Sμ and the second exposure characteristic deterioration quantity Sσ. Namely, the root sum square B is expressed by $$B = (S\mu^2 + S\sigma^2)^{1/2} \quad (3).$$

The root sum square B based on the measured results of the quality assurance objects shown in FIG. 2 is calculated to be 6.8% in accordance with the formula (3).

The entire exposure characteristic deterioration quantity calculating unit 106 calculates an entire exposure characteristic deterioration quantity $\Delta EL_p$ by dividing internally the simple sum A and the root sum square B in m: n. Namely, the entire exposure characteristic deterioration quantity $\Delta EL_p$ is expressed by $$\Delta EL_p = (mA + nB)/(m+n) \quad (4).$$

In a present production line, it has been clear from the verification including the production yield that the precision in the acceptance decision of a projection exposure mask is sufficient in m=n=1.

Accordingly, in the case of m=n=1, the entire exposure characteristic deterioration quantity $\Delta EL_p$ based on the measured results of the quality assurance objects shown in FIG. 2 is calculated to be 6.9% in accordance with the formula (4).

The judgment unit 107 judges whether the calculated entire exposure characteristic deterioration quantity $\Delta EL_p$ is an acceptable value in the design of the projection exposure mask.

The projection exposure mask acceptance decision system has an input/output control device (interface) which connects the input device 30, the output device 31, and the like to the CPU 10, and which is not shown in the figure.

A ROM and a RAM are built into the main storage device 21. The RAM sequentially stores information and the like utilized in process of executing program in the CPU 10, and functions as an information memory or the like utilized as a working area.

The assurance object storage device 22 and the exposure characteristic deterioration quantity storage device 23 are recording devices using well-known magnetic tapes, magnetic drums, magnetic disks, optical disks, magnetooptic disks, semiconductor memories such as ROM, RAM, and the like.

The input device 30 is structured from a keyboard, a mouse, a voice device, a light pen, or the like.

As the output device 31, a liquid crystal display (LCD), a CRT display, a printer, or the like can be used.

Hereinafter, a projection exposure mask acceptance decision method using the projection exposure mask acceptance decision system according to the first embodiment will be described with reference to the flowchart of FIG. 5.

(A) At step S101, a plurality of quality assurance objects of a projection exposure mask such as a photomask, a phase shift mask, an EB mask, or the like are measured by the quality assurance object measuring unit 11 shown in FIG. 1. Then, the measured results of the plurality of quality assurance objects are stored in the assurance object storage device 22.

(B) At step S102, exposure characteristic deterioration quantities $\mu 1$, $\mu 2$, $\mu 3$, ..., and $\mu n$ caused by deviations between the target values and the average values of the measured results are calculated with reference to the measured results of the plurality of quality assurance objects stored in the assurance object storage device 22 by the first exposure characteristic deterioration quantity calculating unit 102. A first exposure characteristic deterioration quantity $S\mu$ is calculated as a simple sum of the exposure characteristic deterioration quantities $\mu 1$, $\mu 2$, $\mu 3$, ..., and $\mu n$ caused by deviations in the respective average values of the plurality of quality assurance objects. The calculated first exposure characteristic deterioration quantity $S\mu$ is stored in the exposure characteristic deterioration quantity storage device 23.

(C) At step S103, by the second exposure characteristic deterioration quantity calculating unit 103, a standard deviation is calculated on the basis of the deviations in the measured results with reference to the measured results of the plurality of quality assurance objects stored in the assurance object storage device 22, and exposure characteristic deterioration quantities $\sigma 1$, $\sigma 2$, $\sigma 3$, ..., and $\sigma n$ caused by deviations are calculated. A second exposure characteristic deterioration quantity $S\sigma$ is calculated as a root sum square of the exposure characteristic deterioration quantities $\sigma 1$, $\sigma 2$, $\sigma 3$, ..., and $\sigma n$ caused by the respective deviations in the plurality of quality assurance objects. The calculated second exposure characteristic deterioration quantity $S\sigma$ is stored into the exposure characteristic deterioration quantity storage device 23.

(D) At step S104, by the sum calculating unit 104, the first exposure characteristic deterioration quantity $S\mu$ and the second exposure characteristic deterioration quantity $S\sigma$ which are stored in the exposure characteristic deterioration quantity storage device 23 are read out, and a simple sum A of the first exposure characteristic deterioration quantity $S\mu$ and the second exposure characteristic deterioration quantity $S\sigma$ is calculated.

(E) At step S105, by the root sum square calculating unit 105, the first exposure characteristic deterioration quantity $S\mu$ and the second exposure characteristic deterioration quantity $S\sigma$ which are stored in the exposure characteristic deterioration quantity storage device 23 are read out, and a root sum square B of the first exposure characteristic deterioration quantity $S\mu$ and the second exposure characteristic deterioration quantity $S\sigma$ is calculated.

(F) At step S106, by the entire exposure characteristic deterioration quantity calculating unit 106, an entire exposure characteristic deterioration quantity $\Delta EL_p$ is calculated by dividing internally the simple sum A and the root sum square B in m:n.

(G) At step S107, by the judgment unit 107, it is judged whether the calculated entire exposure characteristic deterioration quantity $\Delta EL_p$ is an acceptable value in the design of the projection exposure mask. As a result of the judgment, when the entire exposure characteristic deterioration quantity $\Delta EL_p$ is an acceptable value, the projection exposure mask is used. On the other hand, as a result of the judgment, when the entire exposure characteristic deterioration quantity $\Delta EL_p$ is not an acceptable value, the projection exposure mask is not used. However, provided that an exposure device whose precision (for example, focusing precision) is higher than that of the exposure device for the above-described projection exposure mask is used, it is possible to use the above-described projection exposure mask. Namely, provided that an exposure device for a projection exposure mask with a greater entire exposure characteristic deterioration quantity is used, the above-described projection exposure mask can be used.

A series of instructions (a) to (g) shown in FIG. 5 as the projection exposure mask acceptance decision method according to the first embodiment can be execute by controlling the CPU 10 shown in FIG. 1 in accordance with a program having algorithms which are equivalent to those of FIG. 1.

The above-described series of instructions (a) to (g) are as follows.

(a) An instruction for measuring a plurality of quality assurance objects of a projection exposure mask.

(b) A instruction for calculating exposure characteristic deterioration quantities $\mu 1$, $\mu 2$, $\mu 3$, ..., and $\mu n$ caused by deviations between the target values and the average values of the measured results, and to calculate a first exposure characteristic deterioration quantity $S\mu$ as a simple sum of the exposure characteristic deterioration quantities $\mu 1$, $\mu 2$, $\mu 3$, ..., and $\mu n$.

(c) A instruction for calculating a standard deviation on the basis of the deviations in the measured results, to calculate exposure characteristic deterioration quantities $\sigma 1$, $\sigma 2$, $\sigma 3$, ..., and $\sigma n$ caused by deviations, and to calculate a second exposure characteristic deterioration quantity $S\sigma$ as a root sum square of the exposure characteristic deterioration quantities $\sigma 1$, $\sigma 2$, $\sigma 3$, ..., and $\sigma n$.

(d) A instruction for reading out the first exposure characteristic deterioration quantity $S\mu$ and the second exposure characteristic deterioration quantity $S\sigma$, and to calculate a simple sum A of the first exposure characteristic deterioration quantity $S\mu$ and the second exposure characteristic deterioration quantity $S\sigma$.

(e) An instruction for calculating a root sum square B of the first exposure characteristic deterioration quantity $S\mu$ and the second exposure characteristic deterioration quantity $S\sigma$.

(f) An instruction for calculating an entire exposure characteristic deterioration quantity $\Delta EL_p$ by dividing internally the simple sum A and the root sum square B in m:n.

(g) An instruction for judging whether the entire exposure characteristic deterioration quantity $\Delta EL_p$ is an acceptable value in the design of the projection exposure mask by using the calculated entire exposure characteristic deterioration quantity $\Delta EL_p$ as an acceptance criterion.

The program may be stored in the main storage device 21 or the like of the computer system structuring the data processing system shown in FIG. 1.

Further, the program is stored on a computer-readable recording medium, and the recording medium on which the program has been stored is read by the main storage device 21, thereby making it possible to execute the series of instructions according to the embodiment.

Figure 10:
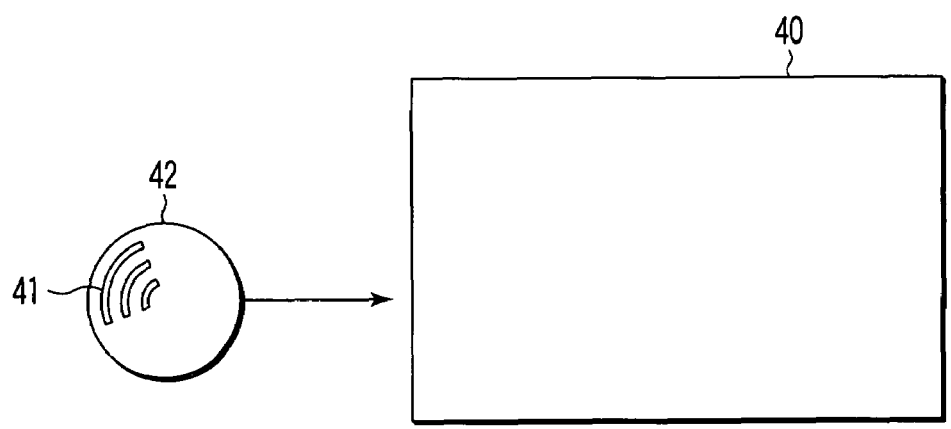
FIG. 10 is a diagram for explanation of a computer program product according to the embodiment.

Namely, the method according to the embodiment can be executed as a computer program product 42 in which a program 41 to be executed by the system including a computer 40 has been recorded as shown in FIG. 10. The program 41 is for making the computer 40 execute instructions corresponding to the instructions (a) to (g).

Here, the computer program product 42 means a medium or the like such as, for example, an external memory device of a computer, a semiconductor memory, a magnetic disk, an optical disk, a magnetooptic disk, a magnetic tape, or the like, on which a program can be recorded.

Concretely, the computer program product 42 is, for example, a flexible disk, a CD-ROM, or an MO disk.

For example, the main body of the projection exposure mask acceptance decision system can be structured so as to build-in or externally connect a flexible disk device (flexible disk drive) and an optical disk device (optical disk drive).

Provided that a flexible disk is inserted into the flexible disk drive, and a CD-ROM is inserted into the optical disk drive, and predetermined reading operations are carried out, it is possible to install the programs stored on these recording media into the main storage device 21.

Further, provided that a predetermined drive device is connected thereto, it is possible to use a ROM serving as a memory device utilized for, for example, a game pack or the like, and to use a cassette tape serving as a magnetic tape device.

Moreover, it is possible to store a program onto another program storage device via an information processing network such as the Internet or the like.

In accordance with the projection exposure mask acceptance decision method using the projection exposure mask acceptance decision system according to the first embodiment, it is possible to provide an appropriate acceptance criterion, and to calculate an exposure characteristic deterioration quantity precisely.

SECOND EMBODIMENT

As shown in FIG. 6, a projection exposure mask acceptance decision system according to a second embodiment is different from the projection exposure mask acceptance decision system shown in FIG. 1 in that a probability density distribution estimating unit 108 is further provided to the CPU 10. Because the other portions are substantially the same as the projection exposure mask acceptance decision system shown in FIG. 1, the duplicate descriptions will be omitted.

The probability density distribution estimating unit 108 estimates a probability density distribution of a population of the quality assurance objects on the basis of measured results of a plurality of quality assurance objects of a projection exposure mask including a test pattern.

To describe concretely, first, a distribution profile is predicted in consideration of a characteristic of a projection exposure mask manufacturing device. Then, after the distribution profile of a probability density distribution is predicted, a probability density distribution is estimated by obtaining a parameter determining a distribution profile by fitting the measured results of the quality assurance objects serving as samples.

For example, given that a value obtained by subtracting a design value from a finished dimension value of a test pattern or the like is $\Delta CD$, a distribution of $\Delta CD_{draw}$ caused by the characteristic of a projection exposure mask drawing device is expressed by $$\Delta CD_{draw} = f_{draw}(x, y) = \sum_{m=0}^{1} \sum_{n=0}^{1-m} \alpha_{mn} x^m y^{1-m-n}. \quad (5)$$

Suppose that it has been known that a distribution of $\Delta CD_{PEB}$ caused by the characteristic of a post exposure bake (PEB) heater is expressed by $$\Delta CD_{PEB} = f_{PEB}(x, y) = \sum_{m=0}^{2} \sum_{n=0}^{2-m} \beta_{mn} x^m y^{2-m-n}, \quad \text{and} \quad (6)$$

a distribution of $\Delta CD_{dev}$ caused by the characteristic of a development device is expressed by $$\Delta CD_{dev} = f_{dev}(x, y) = \sum_{m=0}^{4} \sum_{n=0}^{4-m} \gamma_{mn} x^m y^{4-m-n}, \quad \text{and} \quad (7)$$

a distribution of $\Delta CD_{etch}$ caused by the characteristic of an etching device is expressed by $$\Delta CD_{etch} = f_{etch}(x, y) = \sum_{m=0}^{4} \sum_{n=0}^{4-m} \delta_{mn} x^m y^{4-m-n}. \quad (8)$$

In this case, as a distribution of $\Delta CD$ caused by the mechanical property of a projection exposure mask manufactured by using the above-described various devices, a highest-order number may be taken, and this is predicted to be $$\Delta CD = F(x, y) = \sum_{m=0}^{4} \sum_{n=0}^{4-m} \varepsilon_{mn} x^m y^{4-m-n}. \quad (9)$$

The probability density distribution estimating unit 108 obtains parameters $\varepsilon mn$ by substituting the measured results of the quality assurance objects for the probability density distribution predicted in accordance with the formula (9). A probability density distribution can be estimated due to parameters $\varepsilon mn$ being obtained. Then, the probability density distribution estimating unit 108 determines a confidence interval in the estimated probability density distribution by setting a desired significance level at which it is judged whether the projection exposure mask is acceptable or not.

The second exposure characteristic deterioration quantity calculating unit 103 respectively calculates exposure characteristic deterioration quantities $\sigma n1$ and $\sigma n2$ at an upper limit and a lower limit within the confidence interval, and adopts the greater value between the exposure characteristic deterioration quantities $\sigma n1$ and $\sigma n2$ as an exposure characteristic deterioration quantity $S\sigma$ caused by dispersion in the quality assurance objects.

The adoption of the exposure characteristic deterioration quantities $\sigma n1$ and $\sigma n2$ in the case where measured results of a CD of a manufactured projection exposure mask are used, is exemplified. Fitting of the measured results of the CD of the manufactured projection exposure mask is carried out into formula (9). As a result, parameters $\varepsilon mn$ (m, n=0, 1, 2, 3, 4) shown in FIG. 7 has been obtained.

At this time, a probability density distribution is, as shown in FIG. 8, 6.7 nm within a 95% confidence interval.

The exposure characteristic deterioration quantities $\sigma n1$ and $\sigma n2$ at an upper limit and a lower limit within the confidence interval are obtained by a simulation, and a greater value 7.5%g between the exposure characteristic deterioration quantities $\sigma n1$ and $\sigma n2$ is adopted as an exposure characteristic deterioration quantity $S\sigma$ caused by dispersion in a CD.

Because the 95% confidence interval of ΔCD is, as shown in FIG. 8, from −6.5 to 0.2, an exposure characteristic deterioration quantity Sσ is calculated to be 7.5% in the case of ΔCD=−6.5 which is a greater value between the exposure characteristic deterioration quantities σn1 and σn2.

Figure 9:
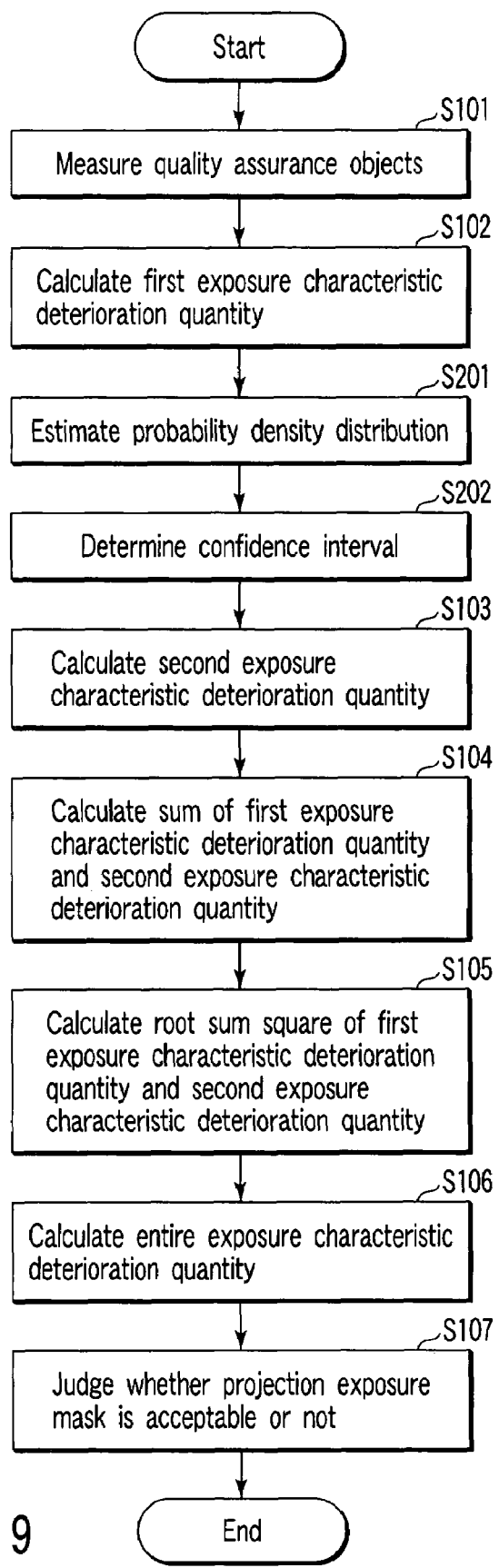
FIG. 9 is a flowchart showing a projection exposure mask acceptance decision method according to the second embodiment.

A projection exposure mask acceptance decision method using the projection exposure mask acceptance decision system according to the second embodiment is different from the flowchart shown in FIG. 5 in that step S201 and step S202 are further added thereto as shown in a flowchart of FIG. 9.

At step S201, by the probability density distribution estimating unit 108, a probability density distribution of a population is estimated on the basis of the measured results of the quality assurance objects of a test pattern or the like.

At step S202, a confidence interval is determined by setting a desired significance level on the basis of the estimated probability density distribution.

At step S103, by the second exposure characteristic deterioration quantity calculating unit 103, exposure characteristic deterioration quantities σn1 and σn2 at an upper limit and a lower limit within the confidence interval are respectively calculated, and the greater value between the exposure characteristic deterioration quantities σn1 and σn2 is adopted as an exposure characteristic deterioration quantity Sσ caused by dispersion in the quality assurance objects. The adopted exposure characteristic deterioration quantity Sσ is stored into the exposure characteristic deterioration quantity storage device 23.

In accordance with the projection exposure mask acceptance decision method using the projection exposure mask acceptance decision system according to the second embodiment, it is possible to provide an appropriate acceptance criterion, and to calculate an exposure characteristic deterioration quantity precisely. Further, in accordance with the projection exposure mask acceptance decision system according to the second embodiment, it is possible to provide a highly-precise acceptance criterion by verifying a probability density distribution with which fluctuation components comply, in advance or in each case.

In the same way as in the first embodiment, as shown in FIG. 10, the method according to the second embodiment as well can be executed as the computer program product 42 on which the program 41 to be executed by the system including the computer 40 has been recorded. In this case, the program 41 is for making the computer 40 execute instructions corresponding to the steps S101 to 102, 201, 103, 104, 105, and 106 shown in FIG. 9.

MODIFIED EXAMPLE

In the projection exposure mask acceptance decision system according to a modified example of the second embodiment, when a resale product of a projection exposure mask in which a second exposure characteristic deterioration quantity Sσ caused by dispersion in the quality assurance objects has been once calculated, or a derivative product under the same design rule is manufactured on the same production line, a known probability density distribution is reusable. Further, provided that a ratio of a confidence interval and a standard deviation is calculated in advance, a confidence interval can be obtained on the basis of only a value of a standard deviation obtained by the measured results of a manufactured projection exposure mask.

THIRD EMBODIMENT

Figure 11:
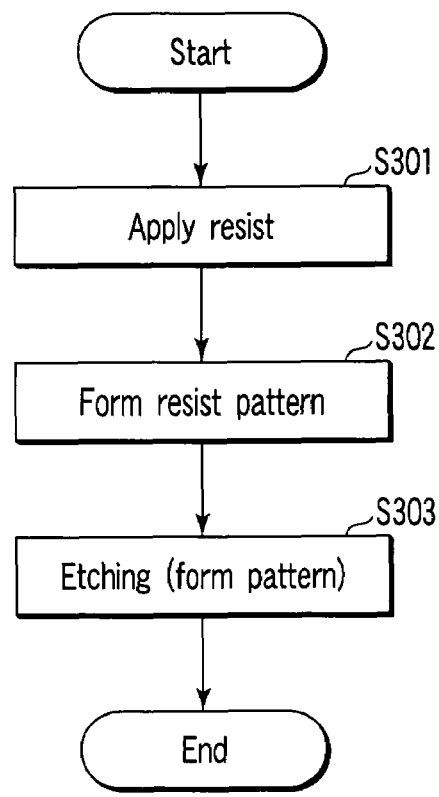
FIG. 11 is a flowchart showing a method for manufacturing a semiconductor device according to the embodiment.

Next, a method for manufacturing a semiconductor device according to the present embodiment will be described with reference to FIG. 11.

First, resist is applied on a substrate including a semiconductor substrate (step S301). The semiconductor substrate is, for example, a silicon substrate or an SOI substrate.

Next, a projection exposure mask which has been judged as acceptable at step S107 in the first or second embodiment is disposed above the substrate, and light or electron beam is irradiated onto the resist via the photomask, and thereafter, a resist pattern is prepared by carrying out development (step S302).

Next, a pattern is formed by etching the substrate by using the resist pattern as a mask (step S303).

Here, when an underlying layer of the resist (the top layer of the substrate) is a polysilicon film or a metal film, a fine electrode pattern, wiring pattern, or the like is formed. When the underlying layer of the resist (the top layer of the substrate) is an insulating film, a fine contact hole pattern, gate insulating film, or the like is formed. When the underlying layer of the resist is the above-described semiconductor substrate, a fine shallow trench isolation (STI) or the like is formed.

In accordance with the present embodiment, because a projection exposure mask which has been judged as acceptable at step S107 is used, it is possible to easily manufacture a highly-integrated/miniaturized semiconductor device including a pattern as desired.

Note that the present invention is not limited to the above-described embodiments.

For example, in the first and second embodiments, exposure margins are regarded as exposure characteristic deterioration quantities. However, focus (DOF) margins may be regarded as those.

Further, in the second embodiment, the precision of the probability density distribution can be further improved by including exponential functions/logarithmic functions in the formula with which a probability density distribution is obtained, on which formula the mechanical property of the manufacturing machine used for manufacturing a projection exposure mask is reflected.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A projection exposure mask acceptance decision system comprising:
    an assurance object measuring unit configured to measure a plurality of quality assurance objects relating to a projection exposure mask;
    a first exposure characteristic deterioration quantity calculating unit configured to calculate a first exposure characteristic deterioration quantity caused by deviations in average values of the plurality of quality assurance objects measured by the assurance object measuring unit;
    a second exposure characteristic deterioration quantity calculating unit configured to calculate a second exposure characteristic deterioration quantity caused by dispersion in the plurality of quality assurance objects measured by the assurance object measuring unit;

a sum calculating unit configured to calculate a simple sum of the first exposure characteristic deterioration quantity and the second exposure characteristic deterioration quantity;

a root sum square calculating unit configured to calculate a root sum square of the first exposure characteristic deterioration quantity and the second exposure characteristic deterioration quantity;

an entire exposure characteristic deterioration quantity calculating unit configured to calculate an entire exposure characteristic deterioration quantity as an interior division value of the simple sum and the root sum square; and a judgment unit configured to judge whether the entire exposure characteristic deterioration quantity is an acceptable value.

2. The projection exposure mask acceptance decision system according to claim 1, further comprising: a probability density distribution estimating unit configured to estimate a probability density distribution relating to the plurality of quality assurance objects on the basis of measured results of the plurality of quality assurance objects.

3. The projection exposure mask acceptance decision system according to claim 2, wherein the probability density distribution estimating unit determines a confidence interval in the probability density distribution by setting a desired significance level for judging whether the projection exposure mask is acceptable or not.

4. The projection exposure mask acceptance decision system according to claim 1, wherein the plurality of quality assurance objects include a CD, a phase shift, and transmittance.

5. A projection exposure mask acceptance decision method comprising:

measuring a plurality of quality assurance objects relating to a projection exposure mask;

calculating a first exposure characteristic deterioration quantity caused by deviations in average values of the plurality of quality assurance objects measured by the assurance object measuring unit;

calculating a second exposure characteristic deterioration quantity caused by dispersion in the plurality of quality assurance objects which measured by the assurance object measuring unit;

calculating a simple sum of the first exposure characteristic deterioration quantity and the second exposure characteristic deterioration quantity;

calculating a root sum square of the first exposure characteristic deterioration quantity and the second exposure characteristic deterioration quantity;

calculating an entire exposure characteristic deterioration quantity as an interior division value of the simple sum and the root sum square; and judging whether the entire exposure characteristic deterioration quantity is an acceptable value.

6. The projection exposure mask acceptance decision method according to claim 5, further comprising: estimating a probability density distribution relating to the plurality of quality assurance objects on the basis of measured results of the plurality of quality assurance objects, and determining a confidence interval on the basis of the estimated probability density distribution.

7. The projection exposure mask acceptance decision method according to claim 6, wherein the estimating the probability density distribution includes: predicting a distribution profile of the probability density distribution in consideration of a characteristic of a projection exposure mask manufacturing device for manufacturing the projection exposure mask; and obtaining parameters for estimating the distribution profile of the probability density distribution by using the measured results of the quality assurance objects.

8. The projection exposure mask acceptance decision method according to claim 7, wherein the plurality of quality assurance objects include a CD, a phase shift, and transmittance.

9. A method for manufacturing a semiconductor device comprising:

applying resist on a substrate including a semiconductor substrate;

forming a resist pattern including disposing a projection exposure mask which is judged as acceptable by the projection exposure mask acceptance decision system according to claim 1, above the substrate, irradiating light or an electron beam onto the resist via the projection exposure mask, and developing the resist onto which the light or the electron beam is irradiated; and forming a pattern by etching the substrate by using the resist pattern as a mask.

10. A computer program product configured to store program instructions for execution on a computer system enabling the computer system to perform:

an instruction for measuring a plurality of quality assurance objects relating to a projection exposure mask;

an instruction for calculating a first exposure characteristic deterioration quantity caused by deviations in average values of the plurality of quality assurance objects which have been measured by the assurance object measuring unit;

an instruction for calculating a second exposure characteristic deterioration quantity caused by dispersion in the plurality of quality assurance objects which have been measured by the assurance object measuring unit;

an instruction for calculating a simple sum of the first exposure characteristic deterioration quantity and the second exposure characteristic deterioration quantity;

an instruction for calculating a root sum square of the first exposure characteristic deterioration quantity and the second exposure characteristic deterioration quantity;

an instruction for calculating an entire exposure characteristic deterioration quantity as an interior division value of the simple sum and the root sum square; and an instruction for judging whether the entire exposure characteristic deterioration quantity is an acceptable value.

* * * * *